(12) United States Patent
Jin et al.

(10) Patent No.: US 11,264,335 B2
(45) Date of Patent: Mar. 1, 2022

(54) ANTI-ELECTROMAGNETIC INTERFERENCE RADIO FREQUENCY MODULE AND IMPLEMENTATION METHOD THEREFOR

(71) Applicant: VANCHIP (TIANJIN) TECHNOLOGY CO., LTD., Tianjin (CN)

(72) Inventors: Fujuan Jin, Tianjin (CN); Yunfang Bai, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 125 days.

(21) Appl. No.: 16/620,457

(22) PCT Filed: Jul. 1, 2018

(86) PCT No.: PCT/CN2018/093940
§ 371 (c)(1),
(2) Date: Dec. 6, 2019

(87) PCT Pub. No.: WO2018/224051
PCT Pub. Date: Dec. 13, 2018

(65) Prior Publication Data
US 2021/0082833 A1    Mar. 18, 2021

(30) Foreign Application Priority Data
Jun. 8, 2017    (CN) .......................... 201710429562.1

(51) Int. Cl.
*H01L 23/552*    (2006.01)
*H01L 23/66*    (2006.01)
(Continued)

(52) U.S. Cl.
CPC ........ *H01L 23/552* (2013.01); *H01L 25/0652* (2013.01); *H01L 25/165* (2013.01);
(Continued)

(58) Field of Classification Search
CPC ........................... H01L 23/552; H05K 9/0024
See application file for complete search history.

(56) References Cited

U.S. PATENT DOCUMENTS

| 2014/0252568 | A1* | 9/2014 | Hwang | ............... H01L 25/0652 |
| | | | | 257/659 |
| 2018/0042147 | A1* | 2/2018 | Mun | ..................... H05K 1/0218 |
| 2018/0116078 | A1* | 4/2018 | Mun | ..................... H01L 23/552 |

FOREIGN PATENT DOCUMENTS

| CN | 104409446 A | * 3/2015 | ............. H01L 24/97 |
| CN | 105990317 A | 10/2016 | |

(Continued)

OTHER PUBLICATIONS

CN 104409446 A—Google Translation PDF provided; 2015.*
(Continued)

*Primary Examiner* — Omar F Mojaddedi
(74) *Attorney, Agent, or Firm* — Ladas & Parry, LLP

(57) ABSTRACT

An anti-electromagnetic interference radio frequency module and an implementation method therefor. The anti-electromagnetic interference radio frequency module comprises a radio frequency module body, the inside of the radio frequency module body is provided with an electrical connection area (1) and a grounding area (2), a metal thin film structure (4) is attached to an upper surface and side surfaces of the radio frequency module body, and the metal thin film structure is connected to the grounding area, forming an anti-electromagnetic interference shielding layer structure which is integrated with the radio frequency module body. The radio frequency module achieves an anti-electromagnetic interference effect by means of the anti-electromag- (Continued)

netic interference shielding layer structure, so that electromagnetic interference generated around the radio frequency module is effectively isolated, thereby improving the performance of the radio frequency module.

8 Claims, 6 Drawing Sheets

(51) Int. Cl.
  *H01L 25/16* (2006.01)
  *H01L 25/065* (2006.01)
  *H01L 21/82* (2006.01)
  *H01L 21/56* (2006.01)
  *H05K 9/00* (2006.01)
  *H05K 1/11* (2006.01)
  *H05K 1/02* (2006.01)
(52) U.S. Cl.
  CPC ........... *H05K 1/0215* (2013.01); *H05K 1/111* (2013.01); *H05K 9/0024* (2013.01)

(56) References Cited

FOREIGN PATENT DOCUMENTS

| CN | 106409781 A | 2/2017 |
| CN | 106711124 A | 5/2017 |
| CN | 107342279 A | 11/2017 |

OTHER PUBLICATIONS

International Search Report in the international application No. PCT/CN2018/093940, dated Oct. 8, 2018.
Written Opinion of the International Search Authority in the international application No. PCT/CN2018/693946, dated Oct. 8, 2018 with English translation provided by Google Translate.

* cited by examiner

ANTI-ELECTROMAGNETIC INTERFERENCE RADIO FREQUENCY MODULE AND IMPLEMENTATION METHOD THEREFOR

CROSS-REFERENCE TO RELATED APPLICATIONS

This application is a national phase application of International Patent Application No. PCT/CN2018/093940, filed on Jul. 1, 2018, which claims priority to Chinese Application No. 201710429562.1, filed on Jun. 8, 2017, the contents of which are hereby incorporated by reference in their entireties.

BACKGROUND

Technical Field

The present invention relates to a radio frequency module, in particular to a radio frequency module with an anti-electromagnetic interference function for radio frequency signal type products and an implementation method of the radio frequency module, and belongs to the technical field of integrated circuit manufacturing.

Related Art

The radio frequency signal type products are widely applied to consumer electronics at present. In constantly upgrading consumer electronics, the integration degree of each functional module is higher and higher. For example, a necessary radio frequency module in a mobile phone determines the signal receiving quality of the mobile phone. When the integration degree is higher, the electromagnetic interference generated by the surroundings on the radio frequency module is stronger, and the performance of the radio frequency module per se is greatly reduced. In order to ensure the required performance matching of the radio frequency module, the electromagnetic interference generated surrounding needs to be effectively isolated. At the same time, in a signal receiving and output process of the radio frequency module, the surrounding electromagnetic interference also needs to be reduced or effectively isolated so as to enhance the intensity of effective signals received/output by the radio frequency module and improve the performance of the radio frequency module.

In the prior art, the electromagnetic interference around the radio frequency module is generally reduced or effectively isolated by using an electromagnetic shielding structure. A conventional electromagnetic shielding structure generally uses a metal cover body to cover the periphery of the radio frequency module. In a preparation process of the electromagnetic shielding structure, the metal cover body is connected to a circuit board in a soldering mode. A product needs a high-temperature re-soldering step, so that the hidden damage to the product may be caused. For example, short circuit due to tin fluid channeling may be caused by solder mask peeling off. Additionally, the high-temperature re-soldering step may also cause problems such as workhour increase and cost increase at a production end. In addition, in order to assemble the metal cover body, a space occupied by the product needs to be increased, so that the product dimension is increased.

Therefore, in view of the defects of the conventional electromagnetic shielding structure in the practical use process, a shielding structure with a reasonable design and being capable of effectively solving the problems needs to be provided.

SUMMARY

The primary technical problem to be solved by the present invention is to provide an anti-electromagnetic interference radio frequency module.

Another technical problem to be solved by the present invention is to provide an implementation method of the radio frequency module.

In order to achieve the goals, the present invention uses the following technical scheme:

According to a first aspect of embodiments of the present invention, an anti-electromagnetic interference radio frequency module is provided, and includes a radio frequency module body, where an electrical connection area and a grounding area are arranged inside the radio frequency module body. A metal thin film structure is attached to an upper surface and side surfaces of the radio frequency module body, and is connected to the grounding area to form an anti-electromagnetic interference shielding layer structure integrated with the radio frequency module.

Preferably, a cross section of a first conductive material is exposed from one or a plurality of side surfaces of the radio frequency module body, and is connected with the metal thin film structure, an opposite end of the cross section of the first conductive material is connected with the grounding area, so that the metal thin film structure is connected to the grounding area to form the anti-electromagnetic interference shielding layer structure of the radio frequency module body.

Preferably, the radio frequency module body includes a base plate. The electrical connection area and the grounding area are arranged on the base plate. The electrical connection area is provided with a single-chip radio frequency module or a multi-chip radio frequency module. The single-chip radio frequency module or the multi-chip radio frequency module and the corresponding first conductive material and a second conductive material are covered inside an epoxy resin filling material to form an inseparable integral sealing structure.

Preferably, the base plate includes but is not limited to any one of a single-layer circuit board, a single-layer circuit framework, a multilayer integrated circuit board and a multilayer integrated circuit framework.

Preferably, the multi-chip radio frequency module consists of a plurality of functional chips and a component. The single-chip radio frequency module consists of a single functional chip or a single functional chip and a component, and the functional chip and the component are respectively and electrically connected with the base plate.

Preferably, the first conductive material, the second conductive material and the metal thin film structure are metal materials with single conduction characteristics or alloy materials with conduction characteristics obtained by mixing various metal materials, and the first conductive material and the second conductive material are in line shapes or strip shapes.

According to a second aspect of the embodiments of the present invention, an implementation method of the anti-electromagnetic interference radio frequency module is provided. The method includes the following steps of:

Step S1, preparing a base plate, and dividing different areas on the base plate;

Step S2, arranging each composition part of a radio frequency module in an electrical connection area of the base plate;

Step S3, electrically connecting a corresponding chip to the base plate and corresponding routing areas in a grounding area and a cutting route area by using conductive materials;

Step S4, filling and covering a molding compound to each space corner of a radio frequency module body so that each composition part of the radio frequency module and the conductive materials are covered in the molding compound;

Step S5, cutting independent encapsulation finished products from an integral sealing structure by a finished product cutting process according to a finished product dimension of a single radio frequency module; and Step S6, converting a radio frequency module body onto a film plating tool for film plating so as to form the anti-electromagnetic interference radio frequency module.

Preferably, in Step S1, at least one grounding routing area is arranged on the base plate, the routing area is respectively grounded, the cutting route area is arranged at the periphery of the base plate, and routing areas are arranged on the cutting route area positioned at any one side or a plurality of sides of the base plate.

Preferably, in Step S2, when a component is contained in the radio frequency module, the component is attached onto the base plate by a surface mounting process so that the component is respectively and electrically connected with the base plate.

Preferably, in Step S2, when a functional chip is contained in the radio frequency module, the functional chip is attached onto the base plate by a mounting process, or the functional chip is directly and electrically connected with the base plate by a reverse mounting process.

Preferably, in Step S3, when the functional chip is attached onto the base plate by the mounting process, the functional chip is electrically connected with the base plate by a lead wire bonding process through a second conductive material, and the grounding routing area is respectively, correspondingly and electrically connected with the routing area in the cutting route area by the lead wire bonding process through a first conductive material.

Preferably, in Step S5, the cutting route area is cut away, and the first conductive material respectively connected with the corresponding grounding routing area is cut to form a cross section, so that the cross section of the first conductive material is respectively exposed from a corresponding surface of a located radio frequency module body.

Preferably, in Step S6, a plurality of independent radio frequency module bodies are converted onto the film plating tool, an upper surface of each independent radio frequency module body faces the upside, and a preset gap is formed between every two independent radio frequency module bodies, so that side surfaces of each radio frequency module body are exposed in the air, a lower surface of the base plate is completely shielded by the film plating tool, a metal thin film structure is attached to the upper surface and the side surfaces of the radio frequency module body, and the metal thin film structure is directly and electrically connected with the cross section of the first conductive material exposed from the side surfaces of the radio frequency module body. Therefore, the metal thin film structure is electrically connected with the grounding area inside the radio frequency module body to form an anti-electromagnetic electromagnetic interference shielding layer integrated with the radio frequency module body.

The anti-electromagnetic interference radio frequency module provided by the present invention integrates the radio frequency module body with the metal thin film structure, and the metal thin film structure is connected to the grounding area inside the radio frequency module body through the first conductive material to form the anti-electromagnetic interference shielding layer structure integrated with the radio frequency module body. The anti-electromagnetic interference effect is achieved through the anti-electromagnetic interference shielding layer structure, so that the electromagnetic interference generated around the radio frequency module is effectively isolated, thereby improving the performance of the radio frequency module. In addition, an existing radio frequency module production process is combined with a metal thin film sputtering process by the radio frequency module, so that the anti-electromagnetic electromagnetic interference shielding layer required for the radio frequency module can be formed in a simpler, more efficient and cost effective manner.

DETAILED DESCRIPTION

The following further describes the technical content of the present invention with reference to the accompanying drawings and specific embodiments.

Figure 1:
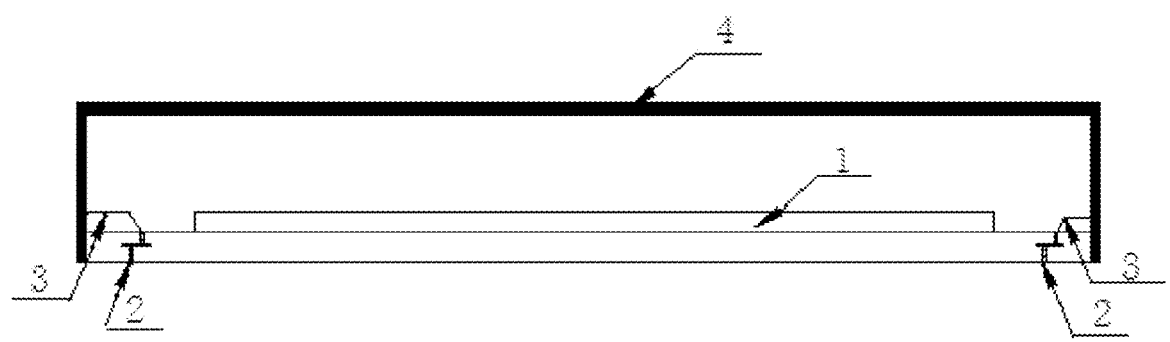
FIG. 1 is a schematic structure diagram of an anti-electromagnetic interference radio frequency module provided by the present invention.
Figure 12:
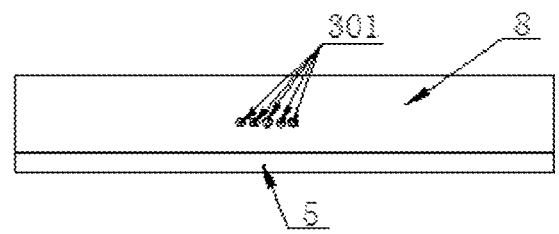

As shown in FIG. 1, an anti-electromagnetic interference radio frequency module provided by the present invention includes a radio frequency module body, where an electrical connection area 1 and a grounding area 2 are arranged inside the radio frequency module body. A cross section of a first conductive material (such as the cross section 301 of the first conductive material shown in FIG. 12) is exposed from one or a plurality of side surfaces of the radio frequency module body. An opposite end of the cross section of the first conductive material is connected with the grounding area 2, and a metal thin film structure 4 is attached to an upper surface and side surfaces of the radio frequency module body, so that the metal thin film structure 4 is connected with the cross section of the first conductive material, and the metal thin film structure 4 is connected to the grounding area 2 to form an anti-electromagnetic interference shielding layer structure. Through the anti-electromagnetic interference shielding layer structure, the electromagnetic interference generated around a radio frequency module is effectively isolated, thereby improving the performance of the radio frequency module.

Figure 2:
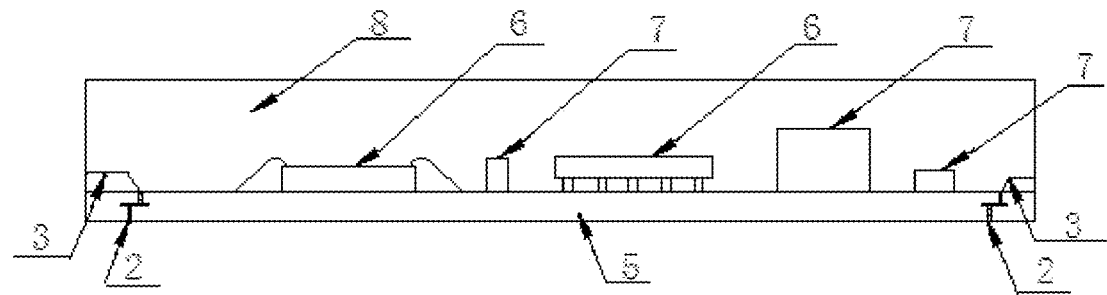
FIG. 2 is a schematic structure diagram of a radio frequency module body using a multichip radio frequency module in the anti-electromagnetic interference radio frequency module provided by the present invention.
Figure 3:
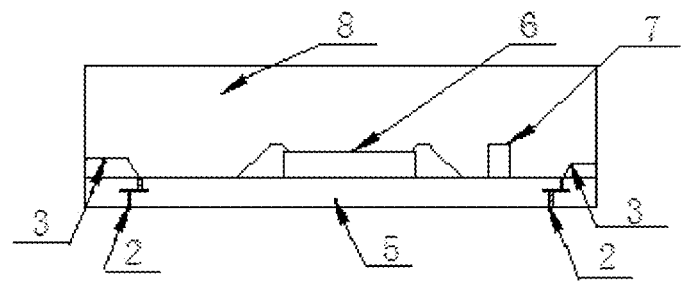
FIG. 3 and FIG. 4 are schematic structure diagrams of a radio frequency module body using a single-chip radio frequency module in the anti-electromagnetic interference radio frequency module provided by the present invention.
Figure 4:
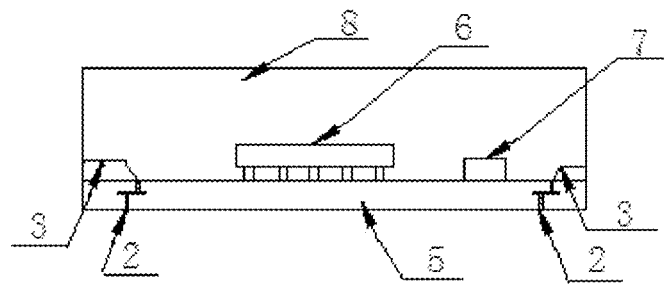
Figure 5:
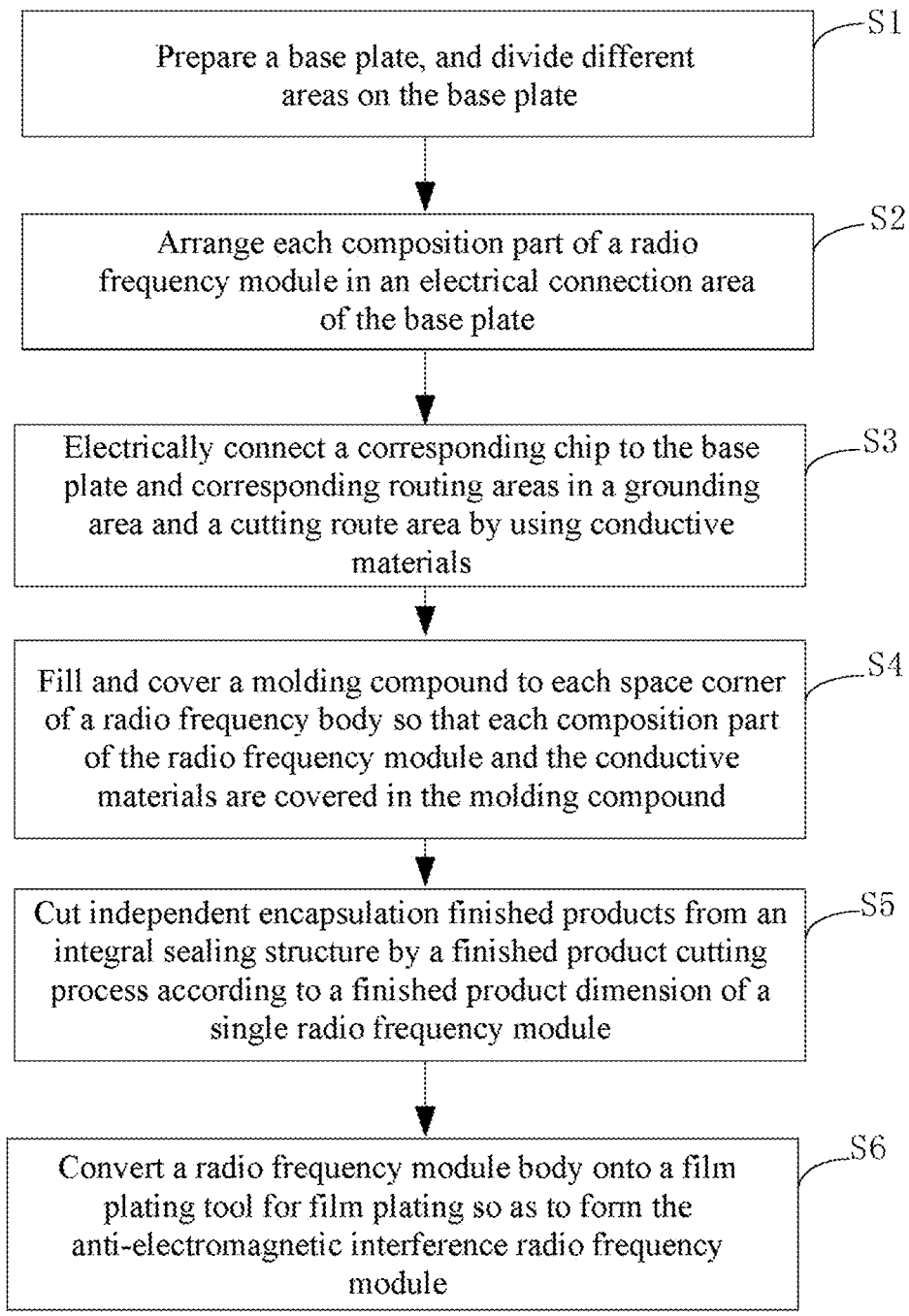
FIG. 5 is a flow diagram of an implementation method of the anti-electromagnetic interference radio frequency module provided by the present invention.

The radio frequency module body refers to an independent encapsulation finished product with a radio frequency function. As shown in FIG. 2-FIG. 4, the radio frequency module body includes a substrate plate 5 (referred to as a base plate for short), the base plate 5 can be a single-layer circuit board or framework, and can also be a multilayer integrated circuit board or framework. The electrical connection area 1 and the grounding area 2 are arranged on the base plate. As shown in FIG. 2, a multi-chip radio frequency module consisting of a plurality of functional chips 6 and a component 7 can be arranged in the electrical connection area 1. A single-chip radio frequency module (not shown in the figures) consisting of a single functional chip 6 can also be arranged in the electrical connection area 1. As shown in FIG. 3 and FIG. 4, the single-chip radio frequency module consisting of a single functional chip 6 and a component 7 can also be arranged in the electrical connection area 1, where the functional chip 6 can be a single radio frequency functional chip, and the functional chip can also be a combination of a plurality of multifunctional chips, for example, the functional chip can be any one or several of chips with radio frequency functions in a radio frequency element, a power amplifier chip, a switch chip, a low-noise amplifier chip, a filter and the like. The functional chip 6 can be attached onto the base plate by a mounting process, and the functional chip 6 is electrically connected with the base plate 5 by one or a plurality of second conductive materials 11 through a lead wire bonding process. The functional chip 6 can also be directly and electrically connected with the base plate 5 by a reverse mounting process. The component 7 can be any one or several of components (the components are also referred to as SMT components), such as a capacitor, a resistor, an inductor and a filter, attached to the base plate 5 by an encapsulation surface mounting process. A position of the grounding area 2 can be set according to the design requirement of a product and the encapsulation process capability, and a size of the grounding area 2 is not limited. The grounding area 2 is connected to one or a plurality of first conductive materials 3 (the opposite end of the cross section of the first conductive material). The first conductive material 3 and the second conductive material 11 can be metal materials with single conduction characteristics, such as metal materials of gold, silver, copper, aluminum, etc. The first conductive material 3 and the second conductive material 11 can also be alloy materials with conduction characteristics obtained by mixing various metal materials, such as alloy materials of copper alloy, silver alloy, etc. Additionally, the first conductive material 3 and the second conductive material 11 can be in line shapes or strip shapes. The first conductive material 3 and the second conductive material 11 are mainly conductive materials capable of being connected by the lead wire bonding process.

As shown in FIG. 2-4, the radio frequency module body uses an encapsulation process to cover an epoxy resin filling material 8 (also referred to as a molding compound) on each space corner on the base plate 5, so that the electrical connection area 1 and the grounding area 2 on the base plate 5 are completely covered in the epoxy resin filling material 8, each composition part of the radio frequency module (the single-chip radio frequency module or the multi-chip radio frequency module) on the electrical connection area 1 is tightly attached to the base plate 5, each composition part of the radio frequency module (the single-chip radio frequency module or the multi-chip radio frequency module) on the electrical connection area 1 and the conductive materials (the first conductive material 3 and the second conductive material 11) are completely covered in the epoxy resin filling material 8, so as to form an inseparable integral sealing structure. Independent encapsulation finished products can be cut and separated from the integral sealing structure by a finished product cutting process in encapsulation according to a finished product dimension of a single radio frequency module, the encapsulation fished product is the radio frequency module body, and the cross section of the first conductive material is exposed from one or a plurality of side surfaces of the radio frequency module body.

In the anti-electromagnetic interference radio frequency module provided by the present invention, the metal thin film structure 4 can be a conductive metal formed by a single conductive material, such as a conductive metal of gold, silver, copper, etc. The metal thin film structure 4 can also be conductive alloy formed by mixing various conductive materials, such as conductive alloy of gold and nickel alloy, stainless steel and copper alloy, nickel and copper alloy, etc. The metal thin film structure 4 is firmly attached to the upper surface and the side surfaces of the radio frequency module body by an encapsulation metal thin film sputtering process, and the metal thin film structure 4 (i.e. a metal plating layer) with a thickness generally between 2 and 15 um is formed. The metal thin film structure 4 cannot generate obvious change on the thickness and the mass of the radio frequency module body, and is integrated with the radio frequency module body to form an inseparable integral structure, i.e. the anti-electromagnetic interference radio frequency module provided by the present invention.

The implementation method of the anti-electromagnetic interference radio frequency module provided by the present invention is concretely illustrated with reference to FIG. 5-14 and using an embodiment with a multi-chip radio frequency module arranged on the base plate 5 of the radio frequency module body as a typical embodiment.

Step S1, a base plate is prepared, and different areas are divided on the base plate.

Figure 6:
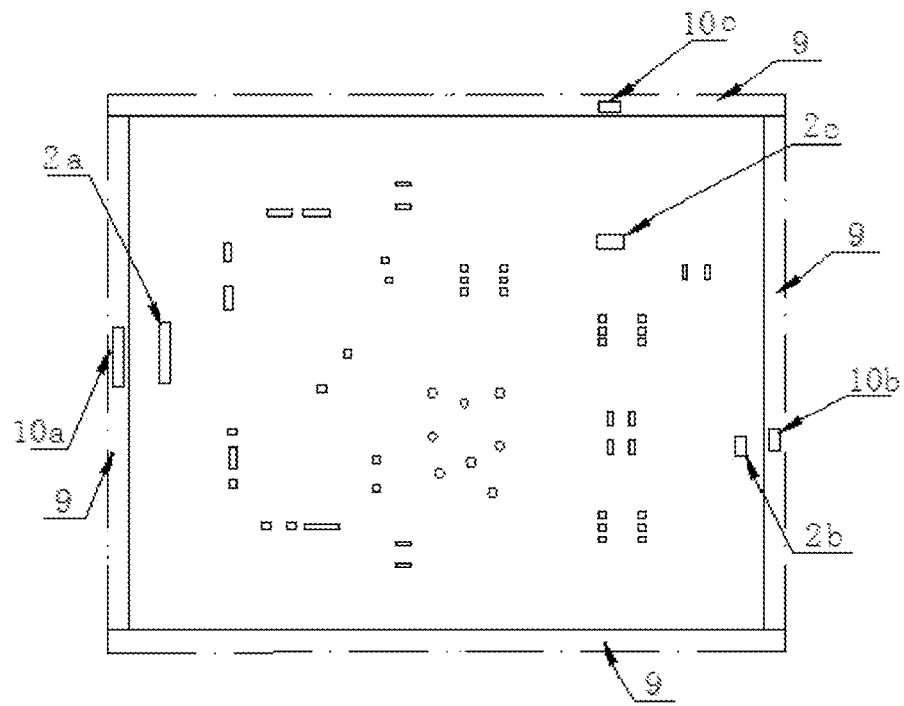
FIG. 6-FIG. 14 are schematic diagrams of a work process of the implementation method of the radio frequency module in FIG. 5.

In the anti-electromagnetic interference radio frequency module provided by the present invention, the base plate 5 can use a multilayer circuit board, and an electrical connection area 1, a grounding area 2 and a cutting route area 9 are arranged on the base plate 5. Specifically, as shown in FIG. 6, three grounding routing areas can be arranged on the base plate 5, and are respectively a routing area 2a, a routing area 2b and a routing area 2c. The routing area 2a, the routing area 2b and the routing area 2c are respectively grounded to form the grounding area 2. The cutting route area 9 used for cutting and separating out independent radio frequency module bodies is arranged at the periphery of the base plate 5. At least one routing area is arranged on the cutting route area 9 positioned at any one or a plurality of sides of the base plate 5. For example, a routing area 10a, a routing area 10b and a routing area 10c can be respectively arranged on the cutting route area 9 positioned at a left side, a right side and a front side of the base plate 5. The routing area 2a, the routing area 2b and the routing area 2c can be arranged in positions near the corresponding cutting route area 9, and preferably correspond to the position of the routing area in the cutting route area 9 so as to reduce the consumption of a conductive material. The positions, numbers and sizes of the grounding routing area and the routing area arranged in the cutting route area 9 can be set according to the design requirement of a product and the encapsulation process capability.

Step S2, each composition part of a radio frequency module is arranged in the electrical connection area of the base plate.

Figure 7:
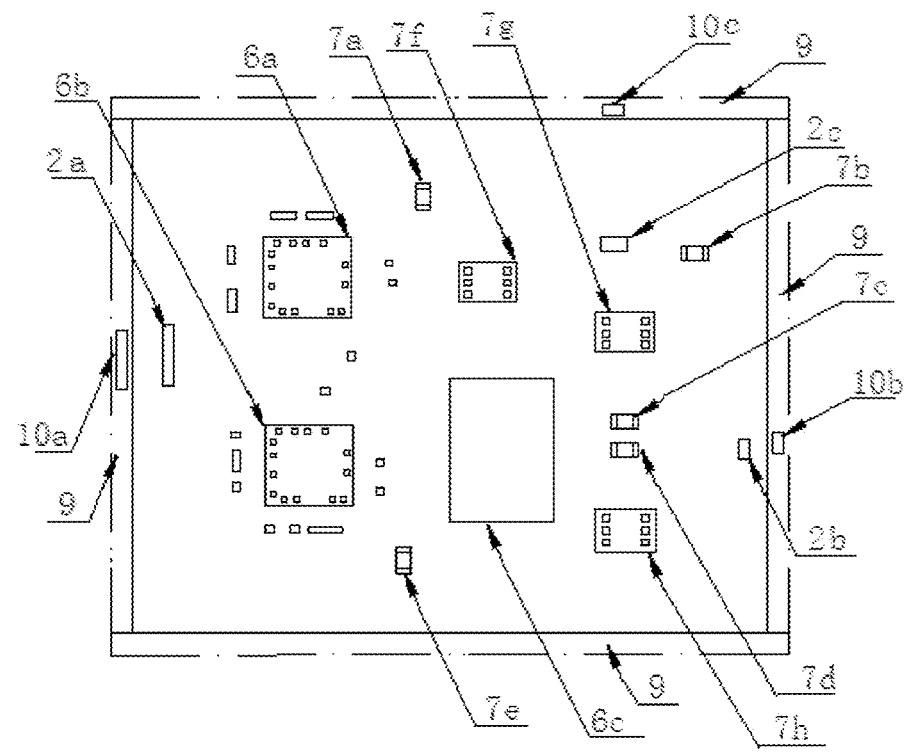

As shown in FIG. 7, two kinds of components in different specifications can be arranged in the electrical connection area 1 of the base plate 5, where the first kind of components are respectively components 7a-7e, and the second components are respectively components 7f-h. The first kind of components 7a-7e and the second kind of components 7f-h are respectively attached onto the base plate 5 by a surface mounting process in encapsulation, so that the components 7a-7e are respectively and electrically connected with the base plate 5. After the components are arranged in the electrical connection area 1 of the base plate 5, two kinds of chips with different functions can also be arranged. The first kind of functional chips are respectively a chip 6a and a chip 6b, the second kind of functional chip is a chip 6c, where the chip 6a and the chip 6b are attached onto the base plate 5 through a mounting process, and the functional chip 6c is directly and electrically connected with the base plate 5 by a reverse mounting process.

Step S3, the corresponding chip is electrically connected with the base plate and the corresponding routing areas in the grounding area and the cutting area by conductive materials.

Figure 8:
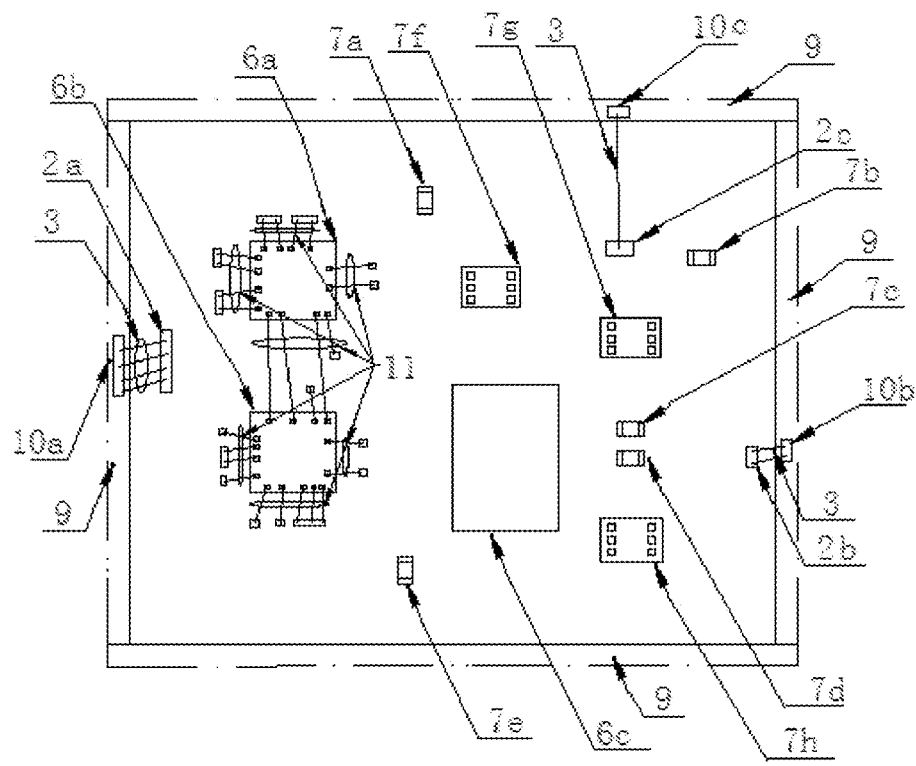
Figure 9:
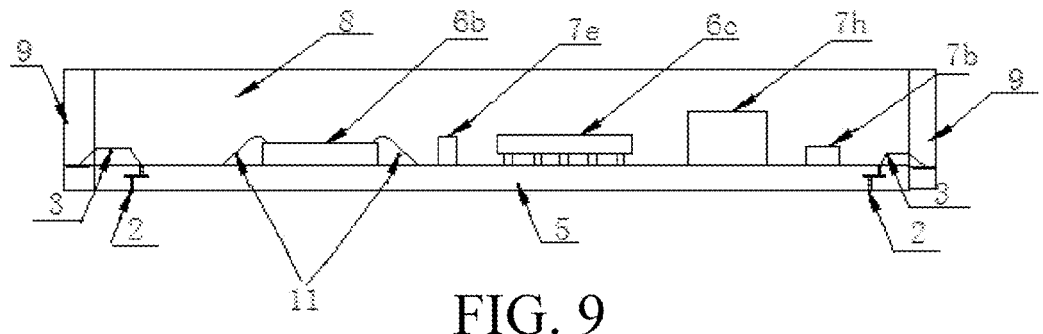

As shown in FIG. 8 and FIG. 9, the conductive materials include a first conductive material 3 and a second conductive material 11. The first conductive material 3 and the second conductive material 11 can use copper alloy conductive wires. By using a plurality of second conductive materials 11 and using a lead wire bonding process, the chip 6a and the chip 6b are electrically connected with the base plate 5. By using one or a plurality of first conductive materials 3 and using the lead wire bonding process, the grounding routing areas 2a-2c are electrically connected with the routing areas 10a-10c in the cutting route area 9, where the electrical connection between the routing area 2a and the routing area 10a, and between the routing area 2b and the routing area 10b is realized by using a plurality of electrical materials, and the electrical connection between the routing area 2c and the routing area 10c is realized by using one electrical material. It should be noted that no special requirements exist on a line arc shape and a height of the first conductive material 3. A connection direction of the first conduction material 3 can be from the grounding routing area to the routing area in the cutting route area 9, and can also be from the routing area in the cutting route area 9 to the grounding routing area, and others follow the lead wire bonding process.

Step S4, a molding compound is filled and covered to each space corner of a radio frequency module body, so that each composition part of the radio frequency module and the conductive materials are covered in the molding compound.

Figure 10:
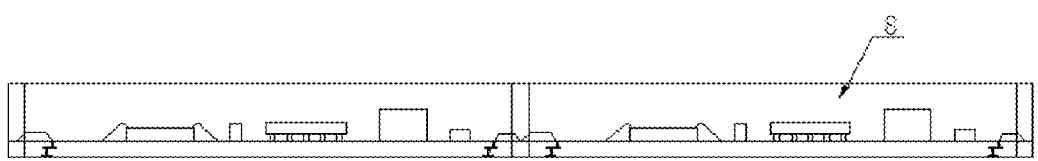

As shown in FIG. 10, the molding compound 8 (an epoxy resin filling material) can be filled and covered on each space corner of the base plate 5 by the encapsulation process, so that the components 7a-7h and the chips 6a-6c positioned in the electrical connection area 1 of the base plate 5, the first conductive material 3 and the second conductive material 11 are completely covered in the molding compound, and the components 7a-7h, the chips 6a-6c and the base plate 5 are tightly attached to form an inseparable integral sealing structure.

Step S5, independent encapsulation finished products are cut from the integral sealing structure by a finished product cutting process according to a finished product dimension of a single radio frequency module.

Figure 11:

As shown in FIG. 11, the independent encapsulation finished products can be cut from the integral sealing structure in Step S4 by the finished product cutting process according to the finished product dimension of the single radio frequency module, and the encapsulation finished product is the radio frequency module body. In the cutting process, the cutting route area 9 is cut away, the first conductive material 3 respectively connected with the corresponding grounding routing area is cut off to form a cross section 301 (shown as FIG. 12), so that the cross section 301 of the first conductive material 3 is respectively exposed from a corresponding surface of a located radio frequency module body. That is, the cross section 301 of the first conductive material 3 can be respectively exposed from three side surfaces of the radio frequency module body provided by the present embodiment. The cross section of the first conductive material 3 is used for being electrically connected with a metal thin film structure 4, so that the metal thin film structure 4 is electrically connected with the grounding area 2. It should be noted that the radio frequency module body is a complete independent individual separated by one-step cutting, and the connection in any form and at any position does not exist after the cutting between the single radio frequency module bodies.

Step S6, the radio frequency module body is converted onto a film plating tool for film plating to form the anti-electromagnetic interference radio frequency module.

Figure 13:
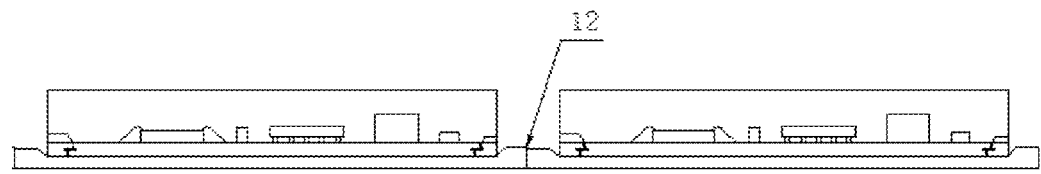
Figure 14:
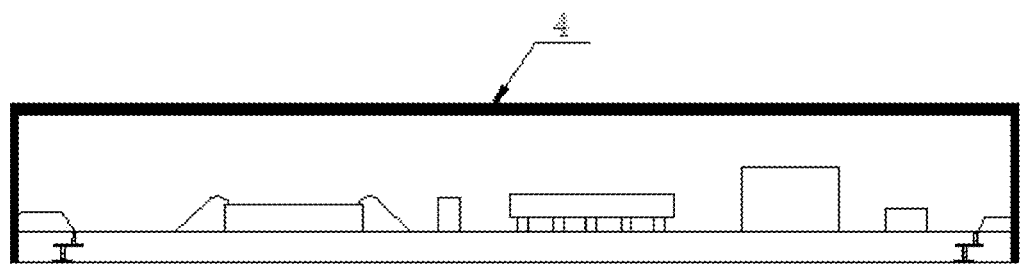

As shown in FIG. 13 and FIG. 14, a plurality of independent radio frequency module bodies in Step S5 are converted onto a tool 12 for metal thin film sputtering (referred to as a film plating tool for short) by a converting device. An upper surface of each independent radio frequency module body (one side filled with the molding compound 8) faces the upside, and a certain gap is formed between every two independent radio frequency module bodies, so that side surfaces (four side surfaces) of each radio frequency module body can be exposed in the air, and a lower surface (one side through which the components and chip lead pins penetrate out) of the base plate 5 is completely shielded by the film plating tool 12. In a sputtering (film plating) process of the metal thin film structure 4, only the five surfaces (the upper surface and the four side surfaces), exposed in the air, of the radio frequency module body are attached by a conductive metal or conductive alloy to form the metal thin film structure 4 with a thickness of 2 to 15 um, and no conductive metal or conductive alloy is attached on the shielded lower surface of the base plate 5. The metal thin film structure 4 cannot generate obvious change on the thickness and the mass of the radio frequency module body per se, and is integrated with the radio frequency module body to form an inseparable structure, i.e. the anti-electromagnetic interference radio frequency module provided by the present invention. As shown in FIG. 14, the metal thin film structure 4 positioned on the upper surface and the side surfaces of the radio frequency module body is directly and electrically connected with the cross section 301 of the first conductive material 3 exposed from the side surfaces of the radio frequency module body, so that the metal thin film structure 4 is electrically connected with the grounding area 2 inside the radio frequency module body to form an anti-electromagnetic electromagnetic interference shielding layer of the radio frequency module body. That is, the cross section 301 of the first conductive material 3 exposed by three side surfaces of the radio frequency module body provided by the present embodiment is respectively and electrically connected with the metal thin film structure 4, the metal thin film structure 4 is electrically connected with the grounding area 2, and the metal thin film structure 4 is electrically connected with the grounding area 2 inside the radio frequency module body. When the anti-electromagnetic interference radio frequency module provided by the present invention works, an anti-electromagnetic interference effect can be achieved through the anti-electromagnetic interference shielding layer of the radio frequency module body, so that the electromagnetic interference generated around the radio frequency module is effectively isolated, thereby improving the performance of the radio frequency module.

According to the anti-electromagnetic interference radio frequency module provided by the present invention, the grounding area and the cutting route area are respectively arranged on the base plate of the radio frequency module body, the grounding area is electrically connected with the routing area of the cutting route area through the first conductive material, and the molding compound is filled and covered to each space corner of the radio frequency module body to form the inseparable integral sealing structure. The independent encapsulation finished products can be cut and separated from the integral sealing structure according to the finished product dimension of the single radio frequency module, and the cross section of the first conductive material is exposed from one or a plurality of side surfaces of the radio frequency module body. The metal thin film structure is arranged on the upper surface and the side surfaces of the radio frequency module body, and the metal thin film structure is directly and electrically connected with the grounding area inside the radio frequency module body to form the anti-electromagnetic interference radio frequency module with the metal thin film structure being integrated with the radio frequency module body. In addition, an existing radio frequency module production process is combined with a metal thin film sputtering process by the radio frequency module, so that the anti-electromagnetic interference shielding layer required for the radio frequency module can be formed in a simpler, more efficient and cost effective manner.

The anti-electromagnetic interference radio frequency module and the implementation method thereof provided in the present invention have been described in detail above. Any obvious modification made by those of ordinary skill in the art to the present invention without departing from the essential of the present invention shall all fall within the protection scope of the present invention.

What is claimed is:

1. An implementation method of an anti-electromagnetic interference radio frequency module, comprising the following steps of:
   Step S1, preparing a base plate, and dividing different areas on the base plate;
   Step S2, arranging each composition part of a radio frequency module in an electrical connection area of the base plate;
   Step S3, electrically connecting a corresponding chip to the base plate and corresponding routing areas in a grounding area and a cutting route area by using conductive materials;
   Step S4, filling and covering a molding compound to each space corner of a radio frequency module body so that each composition part of the radio frequency module and the conductive materials are covered in the molding compound;
   Step S5, cutting independent encapsulation finished products from an integral sealing structure by a finished product cutting process according to a finished product dimension of a single radio frequency module; and
   Step S6, converting a radio frequency module body onto a film plating tool for film plating so as to form the anti-electromagnetic interference radio frequency module.

2. The implementation method of the anti-electromagnetic interference radio frequency module according to claim 1, wherein
   in Step S1, at least one grounding routing area is arranged on the base plate, the routing area is respectively grounded, the cutting route area is arranged at the periphery of the base plate, and routing areas are arranged on the cutting route area positioned at any one side or a plurality of sides of the base plate.

3. The implementation method of the anti-electromagnetic interference radio frequency module according to claim 1, wherein
   in Step S2, when a component is contained in the radio frequency module, the component is attached onto the base plate by a surface mounting process so that the component is respectively and electrically connected with the base plate.

4. The implementation method of the anti-electromagnetic interference radio frequency module according to claim 1, wherein
   in Step S2, when a functional chip is contained in the radio frequency module, the functional chip is attached onto the base plate by a mounting process, or the functional chip is directly and electrically connected with the base plate by a reverse mounting process.

5. The implementation method of the anti-electromagnetic interference radio frequency module according to claim 1, wherein
   in Step S3, when a functional chip is attached onto the base plate by a mounting process, the functional chip is electrically connected with the base plate by a lead wire bonding process through a second conductive material, and a grounding routing area is respectively, correspondingly and electrically connected with the routing area in the cutting route area by the lead wire bonding process through a first conductive material.

6. The implementation method of the anti-electromagnetic interference radio frequency module according to claim 1, wherein
   in Step S5, the cutting route area is cut away, and a first conductive material respectively connected with a corresponding grounding routing area is cut to form a cross section, so that the cross section of the first conductive material is respectively exposed from a corresponding surface of a located radio frequency module body.

7. The implementation method of the anti-electromagnetic interference radio frequency module according to claim 1, wherein
   in Step S6, a plurality of independent radio frequency module bodies are converted onto the film plating tool, an upper surface of each independent radio frequency module body faces the upside, and a preset gap is formed between every two independent radio frequency module bodies, so that side surfaces of each radio frequency module body are exposed in the air, a lower surface of the base plate is completely shielded by the film plating tool, a metal thin film structure is attached to the upper surface and the side surfaces of the radio frequency module body, and the metal thin film structure is directly and electrically connected to a cross section of a first conductive material exposed from the side surfaces of the radio frequency module body, and the metal thin film structure is electrically connected with the grounding area inside the radio frequency module body to form an anti-electromagnetic interference shielding layer integrated with the radio frequency module body.

8. The anti-electromagnetic interference radio frequency module formed by the implementation method according to claim 1.

* * * * *